United States Patent
Munoz et al.

(10) Patent No.: US 9,926,193 B2
(45) Date of Patent: Mar. 27, 2018

(54) MAGNETIC NANOMECHANICAL DEVICES FOR STICTION COMPENSATION

(71) Applicant: Intel Corporation, Santa Clara, CA (US)

(72) Inventors: Jorge A. Munoz, Hillsboro, OR (US); Dmitri E. Nikonov, Beaverton, OR (US); Kelin J. Kuhn, Aloha, OR (US); Patrick Theofanis, Pasadena, CA (US); Chytra Pawashe, Beaverton, OR (US); Kevin Lin, Beaverton, OR (US); Seiyon Kim, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/301,337

(22) PCT Filed: Jun. 27, 2014

(86) PCT No.: PCT/US2014/044594
§ 371 (c)(1),
(2) Date: Sep. 30, 2016

(87) PCT Pub. No.: WO2015/199721
PCT Pub. Date: Dec. 30, 2015

(65) Prior Publication Data
US 2017/0158501 A1   Jun. 8, 2017

(51) Int. Cl.
*B82B 1/00* (2006.01)
*B82B 3/00* (2006.01)
(Continued)

(52) U.S. Cl.
CPC .............. *B82B 1/005* (2013.01); *B82B 1/002* (2013.01); *B82B 3/0023* (2013.01);
(Continued)

(58) Field of Classification Search
CPC ......... H01H 59/0009; H01H 2050/007; H01H 1/0094; B81C 1/0015; G11C 23/00; G11C 11/50; H01L 29/84
See application file for complete search history.

(56) References Cited

U.S. PATENT DOCUMENTS

| 5,278,368 A | 1/1994 | Kasano et al. |
| 6,124,650 A | 9/2000 | Bishop et al. |

(Continued)

OTHER PUBLICATIONS

Cowburn, R P, "Property variation with shape in magnetic nanoelements", *IOP Publishing Ltd,, J. Phys. D: Appl. Phys.* 33 (2000) R1-R16.

(Continued)

*Primary Examiner* — Evan Pert
*Assistant Examiner* — Changhyun Yi
(74) *Attorney, Agent, or Firm* — Schwabe, Williamson & Wyatt P.C.

(57) ABSTRACT

Nanoelectromechanical (NEMS) devices having nanomagnets for an improved range of operating voltages and improved control of dimensions of a cantilever are described. For example, in an embodiment, a nanoelectromechanical (NEMS) device includes a substrate layer, a first magnetic layer disposed above the substrate layer, a first dielectric layer disposed above the first magnetic layer, a second dielectric disposed above the first dielectric layer, and a cantilever disposed above the second dielectric layer. The cantilever bends from a first position to a second position towards the substrate layer when a voltage is applied to the cantilever.

26 Claims, 11 Drawing Sheets

(51) Int. Cl.
- *H01L 29/66* (2006.01)
- *H01L 29/84* (2006.01)
- *H01L 29/82* (2006.01)
- *H01H 59/00* (2006.01)
- *B82Y 15/00* (2011.01)
- *B82Y 25/00* (2011.01)
- *B82Y 40/00* (2011.01)

(52) U.S. Cl.
CPC ... *H01H 59/0009* (2013.01); *H01L 29/66227* (2013.01); *H01L 29/82* (2013.01); *H01L 29/84* (2013.01); *B82Y 15/00* (2013.01); *B82Y 25/00* (2013.01); *B82Y 40/00* (2013.01); *Y10S 977/732* (2013.01); *Y10S 977/838* (2013.01); *Y10S 977/888* (2013.01); *Y10S 977/938* (2013.01)

(56) References Cited

U.S. PATENT DOCUMENTS

| | | | |
|---|---|---|---|
| 6,127,744 A | 10/2000 | Streeter et al. | |
| 2003/0117679 A1* | 6/2003 | Wood | G02B 26/0841 359/226.1 |
| 2007/0209437 A1 | 9/2007 | Xue et al. | |
| 2009/0278111 A1* | 11/2009 | Pop | B82Y 10/00 257/4 |
| 2010/0171575 A1 | 7/2010 | Min et al. | |
| 2013/0105286 A1* | 5/2013 | Despont | H01H 47/00 200/181 |
| 2014/0145804 A1* | 5/2014 | Pagani | H01H 1/0036 335/180 |
| 2015/0179371 A1* | 6/2015 | Hashimoto | H01H 85/463 200/329 |

OTHER PUBLICATIONS

Feng, X. L., et al., "Low Voltage Nanoelectromechanical Switches", *American Chemical Society*, DOI: 10.1021/nl1009734 | *Nano Lett.* 2010, 10, pp. 2891-2896.

Grimme, Stefan, "Semiempirical GGA-Type Density Functional Constructed", *Wiley Periodicals, Inc., J Comput Chem* 27: 2006, pp. 1787-1799.

Hung, A., et al., "First-principles study of metallic iron interfaces", www.elsevier.com/locate/susc, *Surface Science* 501 (2002) pp. 261-269.

Judy, Jack W., "Microelectromechanical systems (MEMS): fabrication, design and applications", *Institute of Physics Publishing Smart Materials and Structures, Smart Mater. Struct.* 10 (2001) 1115-1134 PII: S0964-1726(01)29656-6, Nov. 26, 2001, 22 pages.

Leong, VXH, et al., "Vertical Silicon Nano-Pillar for Non-Volatile Memory", *Transducers'* 11, Beijing, China, Jun. 5-9, 2011, 4 pages.

Liu, Tsu-Jae King, et al., "The Relay Reborn—A tr usted old technology—the electromechanical switch—", Apr. 2012 • *IEEE Spectrum*, 6 pages.

Pawashe, Chytra, et al., "Scaling Limits of Electrostatic Nanorelays", *IEEE Transactions on Electron Devices*, vol. 60, No. 9, Sep. 2013, 7 pages.

Extended European Search Report for European Patent Application No. 14396176.6 dated Dec. 21, 2017, 6 pgs.

* cited by examiner

MAGNETIC NANOMECHANICAL DEVICES FOR STICTION COMPENSATION

TECHNICAL FIELD

Embodiments of the invention are in the field of magnetic devices and, in particular, nanoelectromechanical devices for stiction compensation.

BACKGROUND ART

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

A nanoelectromechanical (NEMS) relay operates like a switch. The NEMS relay uses a voltage to physically open and close a circuit. The NEMS relay has the advantage of energy efficiency by not leaking current when turned off unlike CMOS transistors. However, the physical dimensions at which the nanorelays are operational at low voltages are limited and manufacturing tolerances are small.

DETAILED DESCRIPTION

Nanoelectromechanical (NEMS) devices with nanomagnets for stiction compensation are described. In the following description, numerous specific details are set forth, such as specific magnetic layer integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments are directed to NEMS devices with nanomagnets for improved control of an operating voltage of the NEMS device (e.g., lower operating voltage of the NEMS device) and improved control of a size of a cantilever and control of a gap between the cantilever and a substrate of the NEMS device. Applications may include use in CPUs, processors, chipsets, wireless devices, etc. for computations (e.g., lower performance computations).

Figure 1:
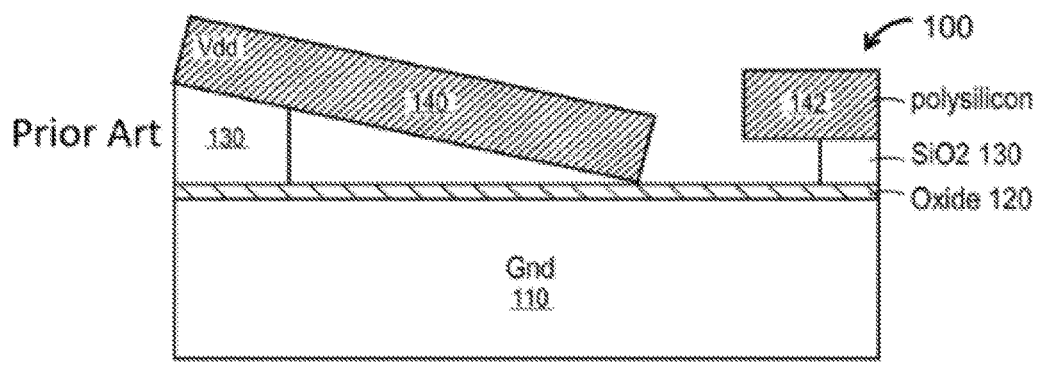
FIG. 1 illustrates a cross-sectional view of a nanoelectromechanical (NEMS) device in accordance with a conventional approach.

FIG. 1 illustrates a cross-sectional view of a nanoelectromechanical (NEMS) device in accordance with a conventional approach. The device 100 includes a silicon substrate 110 that acts as a ground electrode, an oxide layer 120, a SiO2 layer 130, and polysilicon layer 140 and 142. The layer 140 is a cantilever that includes a free end that moves towards the substrate if a voltage is applied to the layer 140 as illustrated in FIG. 1. The free end moves away from the substrate if no voltage is applied to the layer 140 (e.g., Vdd electrode).

Figure 2A:
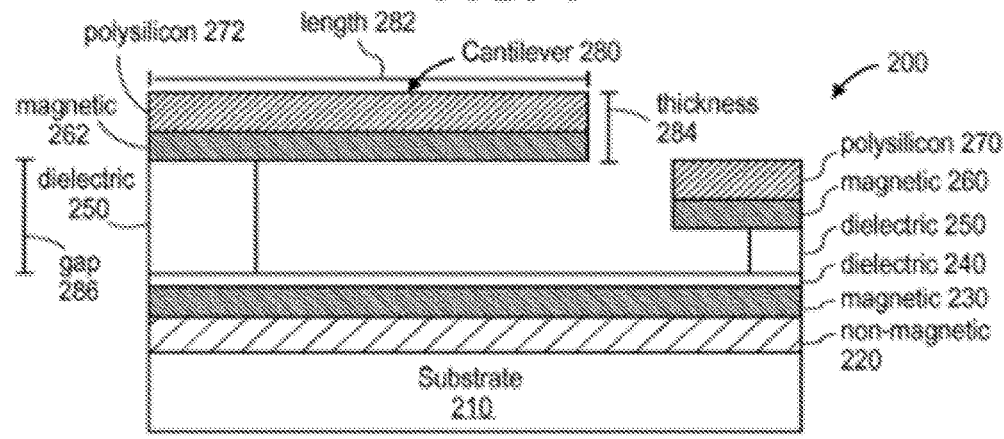
FIGS. 2A and 2B illustrate cross-sectional views of a nanoelectromechanical (NEMS) device with nanomagnets in accordance with an embodiment of the present invention.
Figure 2B:
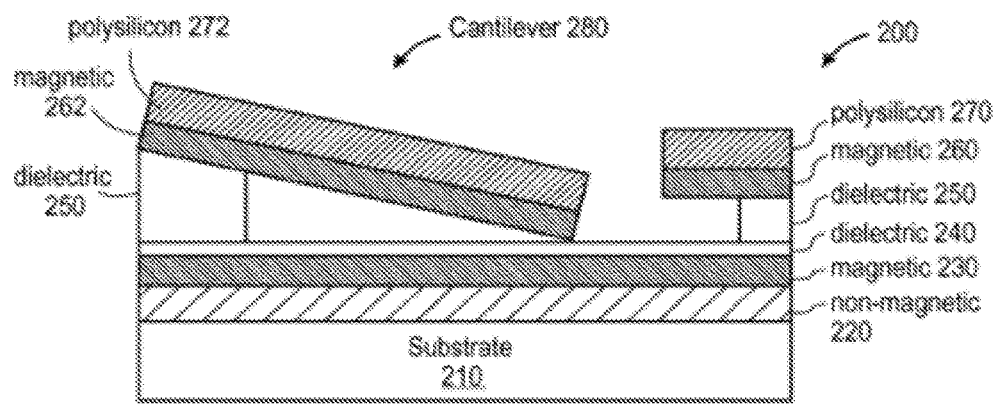

FIGS. 2A and 2B illustrate cross-sectional views of a nanoelectromechanical (NEMS) device with nanomagnets, in accordance with an embodiment of the present invention. The device 200 includes a substrate layer 210 (e.g., a silicon substrate layer), a non-magnetic layer 220 disposed above the substrate layer, a first magnetic layer 230 disposed above the non-magnetic and substrate layers, a first dielectric layer 240 disposed above the first magnetic layer, a second dielectric 250 (e.g., sacrificial oxide) disposed above the first dielectric layer, and a cantilever 280. The cantilever 280 includes a magnetic layer 262 and a polysilicon layer 272. The magnetic layer 260 may be formed from the same or different magnetic layer in comparison to magnetic layer 262. The polysilicon layer 270 may be formed from the same or different polysilicon layer in comparison to polysilicon layer 272. FIG. 2A illustrates the cantilever 280 in a first position with no voltage applied between the polysilicon layer 272 (i.e., Vdd electrode) and the substrate 210 (i.e., ground electrode). FIG. 2B illustrates the cantilever 280 in a second position with voltage (e.g., Vdd) applied between the polysilicon layer 272 (i.e., Vdd electrode) and the substrate 210 (i.e., ground electrode) for a certain time period (e.g., 1 nanosecond). The cantilever bends from a first position to a second position in contact with the first dielectric layer when a voltage is applied to the cantilever. The cantilever is restored from the second position to the first position having no contact with the first dielectric layer when the voltage is removed from the cantilever. The substrate layer 210 acts as a ground electrode when the voltage (Vdd) is applied to the cantilever. The cantilever has a length 282, a thickness 284, and a gap 286 represents a distance from a lower surface of the cantilever to an upper surface of the dielectric layer 240.

In one embodiment, the non-magnetic layer includes at least one of Ruthium (Ru), Tantalum (Ta), Titanium (Ti), Zirconium (Zr), Hafnium (Hf), and Magnesium (Mg). The non-magnetic layer provides a crystallization template (e.g., orientation) for the magnetic layer 230. The magnetic layers 230, 260, and 262 may include Cobalt (Co) or other suitable ferromagnetic layers (e.g., Fe). The dielectric layer 240 may be magnesium oxide (MgO) or any other appropriate dielectric layer.

The magnetic layers 230 and 262 (e.g., nanomagnets) remain magnetized in the same direction because of their size (e.g., long and thin) and magnetic anisotropy. These nanomagnets produce magnetic repulsion force that counteracts an adhesion force of the cantilever and improves the range of operational voltages and size ranges for the cantilever as discussed below.

Figure 3:
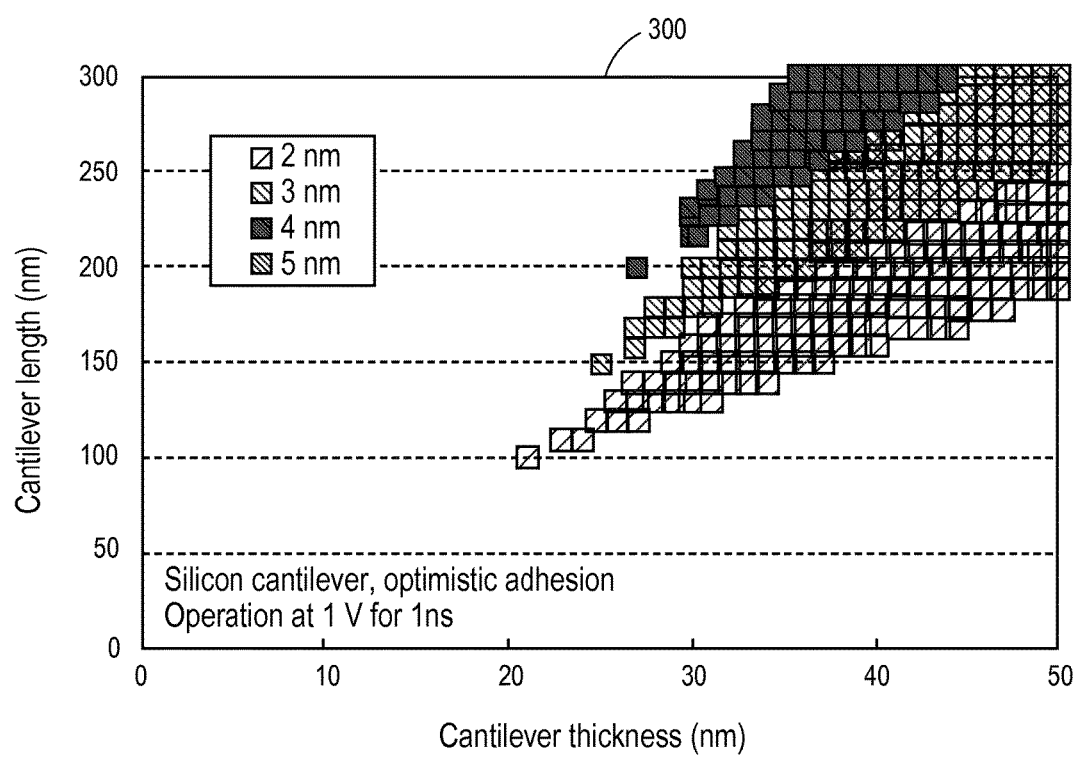
FIG. 3 illustrates a plot of cantilever length versus cantilever thickness for different gaps in accordance with one embodiment of the present invention.

FIG. 3 illustrates a plot of cantilever length versus cantilever thickness for different gaps in accordance with one embodiment of the present invention. The plot 300 shows cantilever length (nanometers (nm)) versus cantilever thickness (nm) for a silicon cantilever operating at 1 volt (i.e., Vdd of 1 volt) for gaps of 2, 3, 4, and 5 nm between a lower surface of a cantilever and an upper surface of the substrate. This particular device, which does not include nanomagnets, does not work in the dimension of interest at gap separations of 5 nm or greater, hence the absence of 5 nm shaded regions in the plot. Gaps of less than 2 nm have not been shown on the plot because tunneling current begins to be significant in this regime. For the non-operational region below the 2 nm region, the cantilever is stiff (e.g., not able to bend sufficiently) due to a short length and does not have a sufficient electrostatic force from the applied voltage. For the non-operational region above the 4 nm region, the cantilever is soft (e.g., remains in a bent position in contact with a dielectric layer) due to a longer length and does not have a sufficient electrostatic force from the applied voltage to overcome the adhesion force. The optimistic adhesion force used for the plot includes only van der Waals forces. Environmental conditions such as humidity and metallic bonding can increase stiction by as much as two order of magnitude have not been accounted for in this plot. Stiction is the static friction that needs to be overcome to enable relative motion of stationary objects in contact. These environmental conditions are undesirable and would modify the operational range, but not the general trends in the plot 300.

Figure 4:
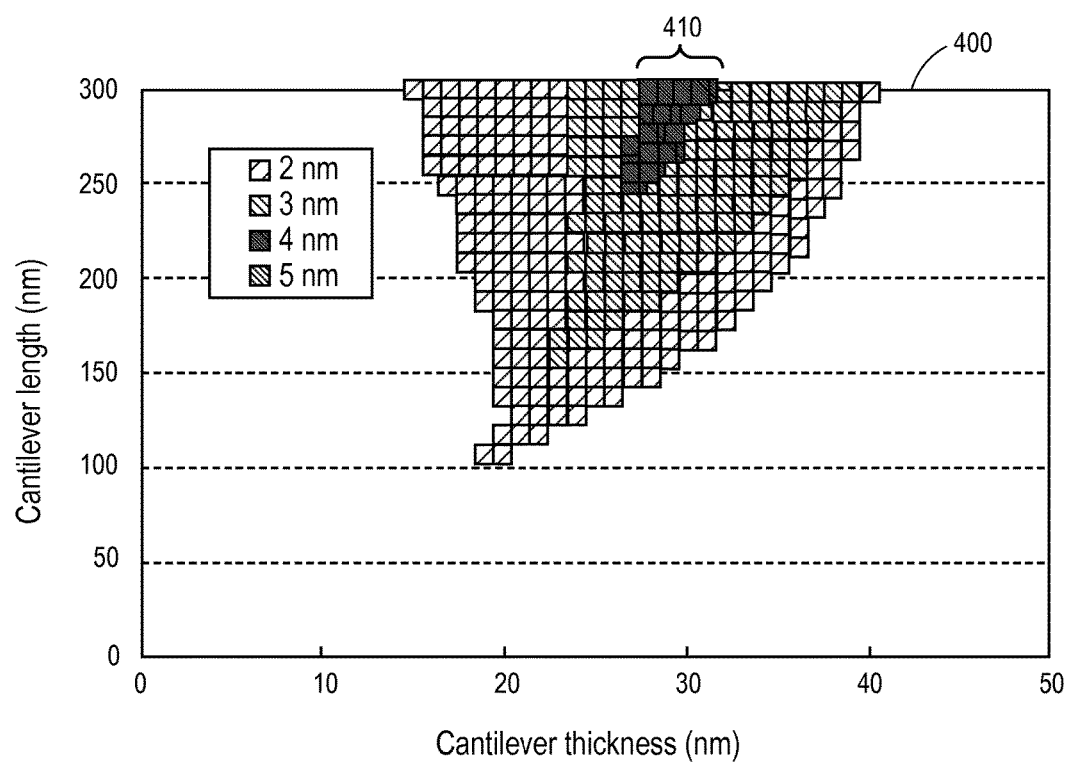
FIG. 4 illustrates a plot of cantilever length versus cantilever thickness for different gaps in a device that includes nanomagnets in accordance with one embodiment of the present invention.

When nanomagnets are included in the design of the device, then the operational range is increased as illustrated in FIG. 4. FIG. 4 illustrates a plot of cantilever length versus cantilever thickness for different gaps in a device that includes nanomagnets in accordance with one embodiment of the present invention. The plot 400 shows cantilever length (nanometers (nm)) versus cantilever thickness (nm) for a silicon cantilever operating at 1 volt (i.e., Vdd of 1 volt) for gaps of 2, 3, 4, and 5 nm between a lower surface of a cantilever and an upper surface of the substrate. This particular device, which does include nanomagnets, does not work in the dimension of interest at gap separations of 5 nm or greater, hence the absence of 5 nm shaded regions in the plot. Gaps of less than 2 nm have not been shown on the plot because tunneling current begins to be significant in this regime. The optimistic adhesion force used for the plot includes only van der Waals forces.

Figure 5A:
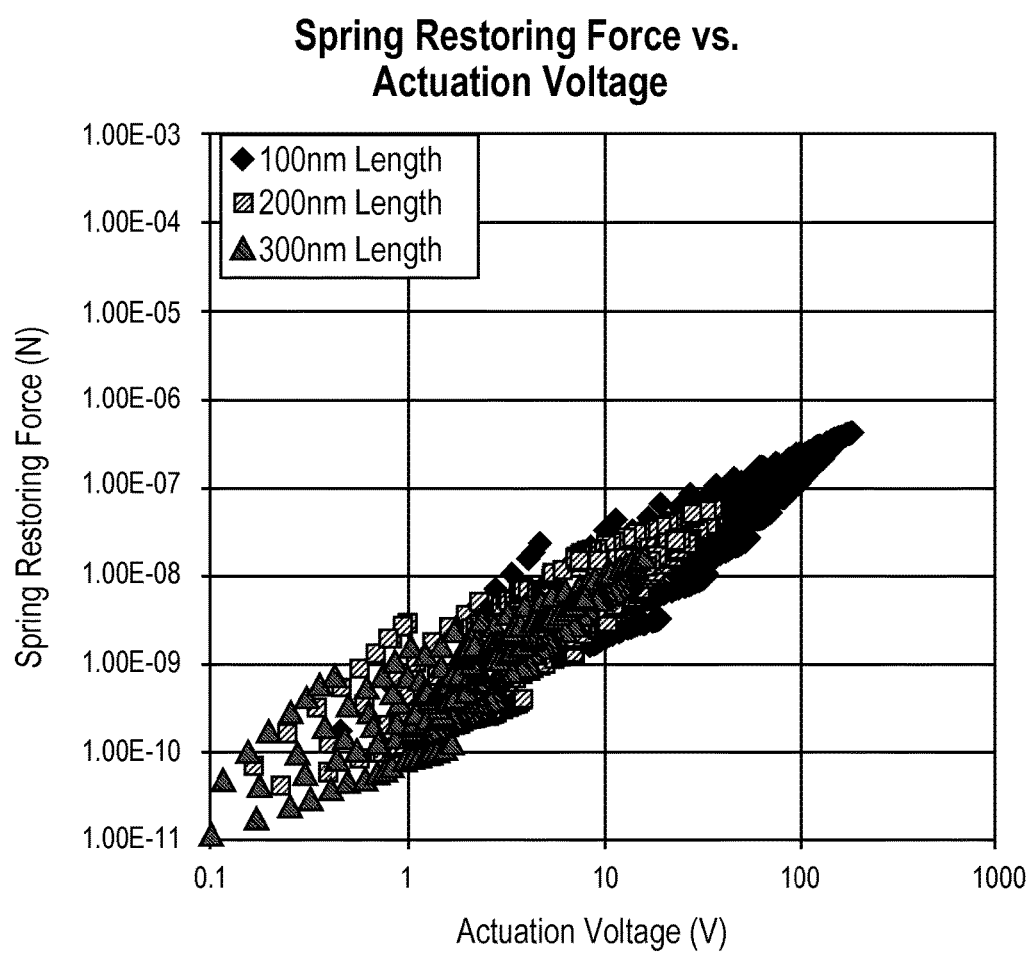
FIG. 5A illustrates a plot of spring restoring force of a silicon cantilever as a function of the actuation voltage for different cantilever geometries in accordance with one embodiment of the invention.

The plots 300 and 400 have been simulated using a parallel plate relay. The restoring force originates from the effective spring constant of the cantilever while the electrostatic force originates from the analytical electrostatic attraction between parallel plates. The adhesion forces were calculated with density functional theory expanded with a force field that accounts for van der Waals interactions. The magnetic forces were calculated using a model to scale the forces from atomic dipole-dipole interactions into the continuum regime. To verify that the parallel plate relay model is reliable, the spring restoring force of a silicon cantilever as a function of the actuation voltage was calculated numerically accounting for fringing capacitance and different cantilever geometries with the results being plotted in FIG. 5A for a cantilever in accordance with one embodiment of the invention. The cantilever has a width of 5 nm, a gap that varies from 3-30 nm, a thickness that varies from 3-30 nm, and a length that varies from 100-300 nm in length. The data points with a higher restoring force have a higher cantilever thickness while the data points with a lower restoring force have a smaller gap.

The nanomagnets improve the robustness of this device by expanding the gap operational range since the gap is the smallest and most difficult dimension to control and the device is very sensitive to this parameter. The nanomagnets also allow an overlap of the operational regions at different thicknesses (e.g., 2-4 nm) as illustrated in the plot 400. For example, the region 410 is an overlap region where the device is operational for gaps of 2, 3, and 4 nm. For this overlap region 410, the device has a length of approximately 250-300 nm and a thickness of approximately 25-30 nm. In this embodiment, the magnetic material occupies approximately half of the cantilever although other dimensions for the magnetic material will work as well. A strong nanomagnet includes a magnetic moment similar to iron and the operational range can be further optimized by selected an appropriate magnetic element or alloy.

Figure 5B:
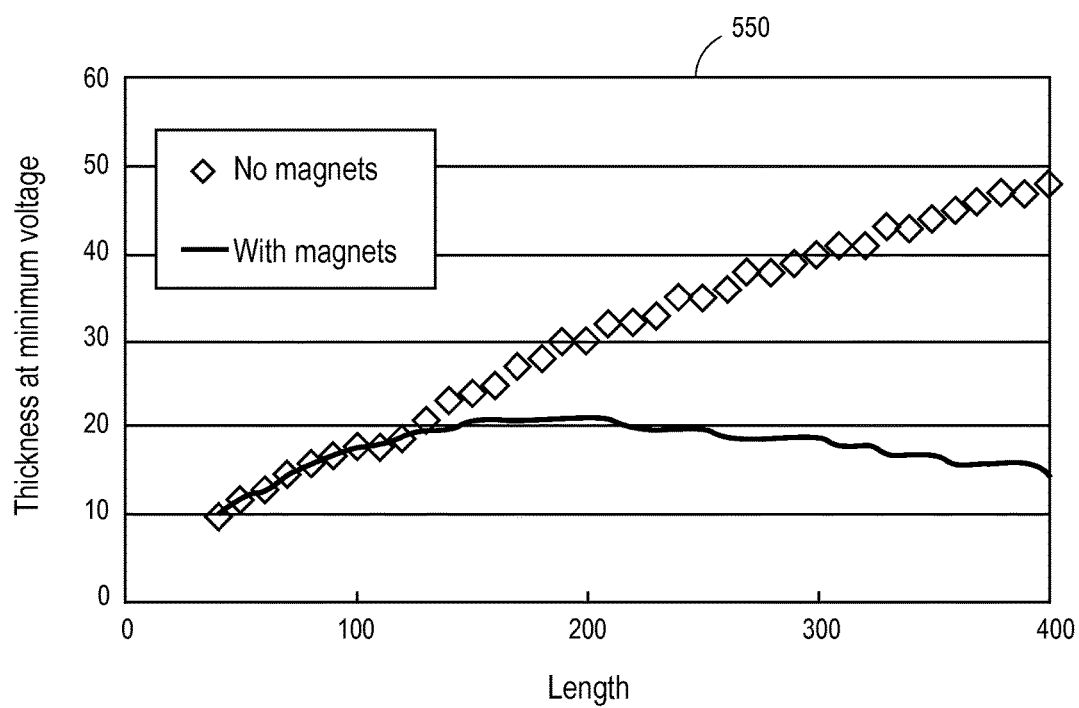
FIG. 5B illustrates a plot of cantilever thickness at a minimum voltage versus cantilever length for a device that includes nanomagnets and for a device that does not include nanomagnets in accordance with one embodiment of the present invention.

FIG. 5B illustrates a plot of cantilever thickness at a minimum voltage (e.g., 1 volt) versus cantilever length for a device that includes nanomagnets and for a device that does not include nanomagnets in accordance with one embodiment of the present invention. The plot 550 shows cantilever thickness (nanometers (nm)) versus cantilever length (nm) for a silicon cantilever operating at 1 volt (i.e., Vdd of 1 volt) for a device with no magnets and for a device with nanomagnets. When the cantilever is longer than about 100 nm, the nanomagnets reduce the thickness necessary to operate the cantilever. The thickness and length of the cantilever determine a restoring force needed to restore the cantilever from a bent position as illustrated in FIG. 2B to a restored position as illustrated in FIG. 2A.

NEMS devices (e.g., NEMS relays or switches) can be made by techniques currently used to fabricate CMOS chips and have recently been used for computation applications. The NEMS devices are currently at least 100 times slower than CMOS devices, but have no leakage current. A NEMS device capable of computation can be achieved in several ways. For example, the NEMS relay that has been modeled and plotted includes a silicon cantilever and substrate. When a voltage is applied, an electrostatic force bends the cantilever towards the substrate. An operational cantilever makes contact during the time that the voltage is applied as illustrated in FIG. 2B and returns to its original position as illustrated in FIG. 2A after the voltage is removed due to its restoring force. A first failure mode is the cantilever being so stiff that it does not make contact while a second failure mode is the cantilever being so soft that it can not separate from the dielectric layer disposed on the substrate due to van der Waals forces or other adhesion forces. Therefore, for the device to work, the electrostatic force has to be greater than a restoring force and the restoring force greater than an adhesion force as illustrated in FIG. 6-8.

Figure 6:
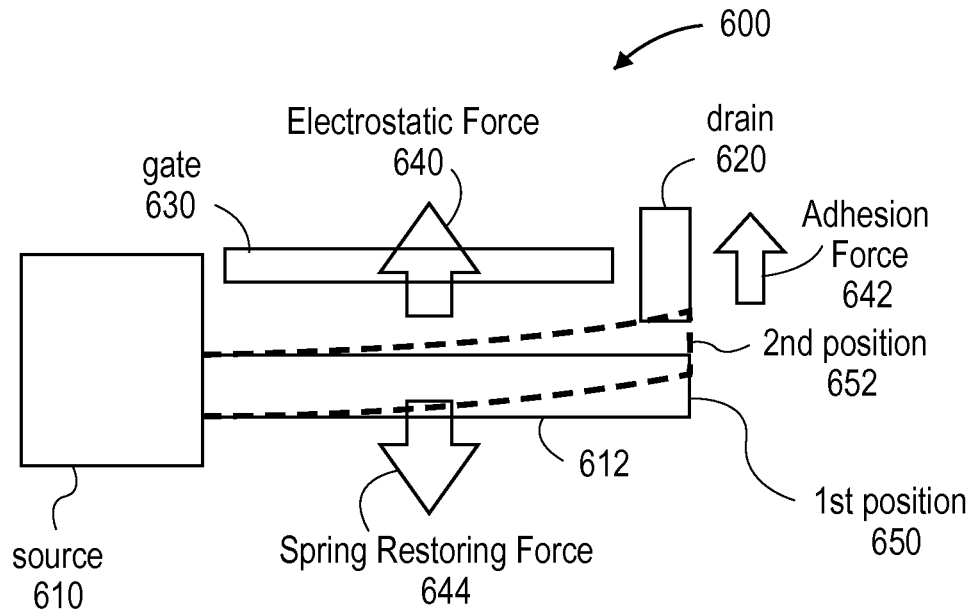
FIG. 6 illustrates a NEMS device for switching from a first position (e.g., logic level 0) to a second position (e.g., logic level 1).

FIG. 6 illustrates a NEMS device for switching from a first position (e.g., logic level 0) to a second position (e.g., logic level 1). The device 600 includes a source region 610 that includes a cantilever 612, a drain region 620, and a gate region 630. Application of an electrostatic force 640 causes the cantilever 612 to bend towards the drain region 620 with a free end of the cantilever contacting the drain region 620 if the electrostatic force and adhesion force 642 are greater than a spring restoring force 644. The device switches from the first position 650 (e.g., logic level 0) to the second position 652 (e.g., logic level 1) having dashed lines in FIG. 6 if the electrostatic force and adhesion force 642 are greater than a spring restoring force 644.

Figure 7:
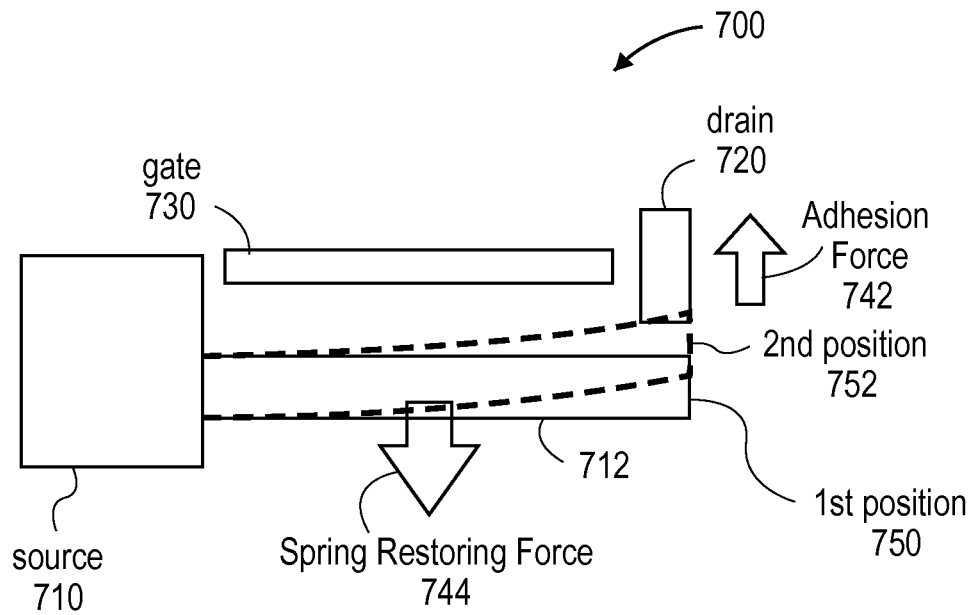
FIG. 7 illustrates a NEMS device for switching from a second position (e.g., logic level 1) to a first position (e.g., logic level 0).
Figure 8:
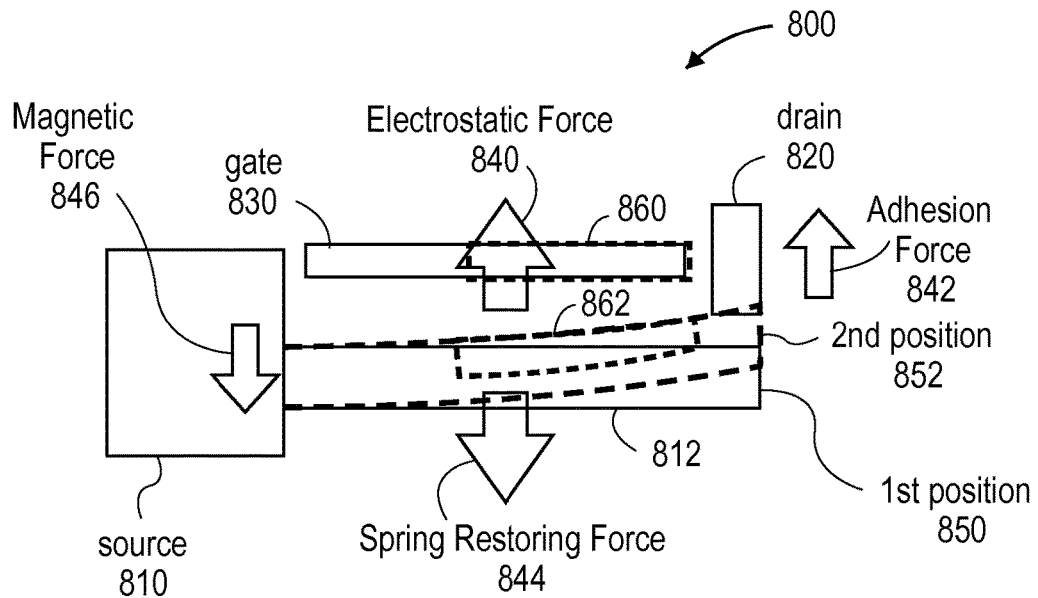
FIG. 8 illustrates a NEMS device having nanomagnets for switching from a first position (e.g., logic level 0) to a second position (e.g., logic level 1) in accordance with one embodiment of the present invention.

FIG. 7 illustrates a NEMS device for switching from a second position (e.g., logic level 1) to a first position (e.g., logic level 0). The device 700 includes a source region 710 that includes a cantilever 712, a drain region 720, and a gate region 730. The absence of an electrostatic force causes the cantilever 712 to be restored with a free end of the cantilever moving away from the drain region 720 if a spring restoring force 744 is greater than an adhesion force 742. The device switches from the second position 752 (e.g., logic level 1) having dashed lines in FIG. 7 to the first position 750 (e.g., logic level 0) if the spring restoring force 744 is greater than the adhesion force 742.

Typically, NEMS relays are built with a cantilever length of several micrometers down to a few hundreds of nanometers. At the micro scale, the relays can operate close to 1 volt, but at the nano scale the adhesion and restoring forces increase such that the operation voltage is about an order of magnitude higher. Inherent adhesion forces are the primary limitation for low voltage operation of the nano relays at dimension comparable to current MOS transistors.

Embodiments of the present design include at least two long and thin slabs of a magnetic material in the device to partially offset the adhesion forces to have more flexibility on the range of dimensions of the devices and a better tolerance for variations in the gap.

FIG. 8 illustrates a NEMS device having nanomagnets for switching from a first position (e.g., logic level 0) to a second position (e.g., logic level 1) in accordance with one embodiment of the present invention. The device 800 includes a source region 810 that includes a cantilever 812, a drain region 820, and a gate region 830. The cantilever includes a magnetic material 862 with dashed lines in FIG. 8 while the gate also includes a magnetic material 860 with dashed lines in FIG. 8. Application of an electrostatic force 840 causes the cantilever 812 to bend towards the drain region 820 with a free end of the cantilever contacting the drain region 820 if the electrostatic force and adhesion force 842 are greater than a spring restoring force 844 and a magnetic force 846. The device switches from the first position 850 (e.g., logic level 0) to the second position 852 (e.g., logic level 1) having dashed lines in FIG. 8 if the electrostatic force and adhesion force 842 are greater than a spring restoring force 844 and the magnetic force 846.

Figure 9:
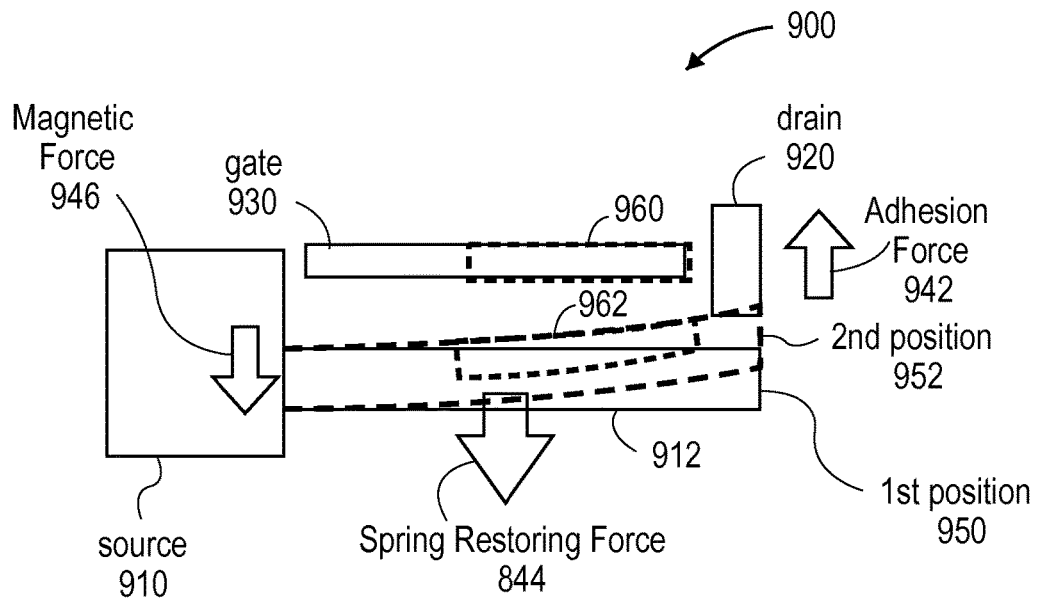
FIG. 9 illustrates a NEMS device having nanomagnets for switching from a second position (e.g., logic level 1) to a first position (e.g., logic level 0) in accordance with one embodiment of the present invention.

FIG. 9 illustrates a NEMS device having nanomagnets for switching from a second position (e.g., logic level 1) to a first position (e.g., logic level 0) in accordance with one embodiment of the present invention. The device 900 includes a source region 910 that includes a cantilever 912, a drain region 920, and a gate region 930. The cantilever includes a magnetic material 962 with dashed lines in FIG. 9 while the gate also includes a magnetic material 960 with dashed lines in FIG. 9. The absence of an electrostatic force causes the cantilever 912 to be restored with a free end of the cantilever moving away from the drain region 920 if a spring restoring force 944 and a magnetic force 946 are greater than an adhesion force 942. The device switches from the second position 952 (e.g., logic level 1) having dashed lines in FIG. 9 to the first position 950 (e.g., logic level 0) if the spring restoring force 944 and the magnetic force are greater than the adhesion force 942.

The position, length, thickness, and type of magnetic material can be altered in comparison to the examples of FIGS. 8 and 9 to partially offset the adhesion forces to have more flexibility on the range of dimensions of the devices and a better tolerance for variations in the gap. The nanomagnets can be poled along their long direction with an external magnetic field and afterwards the nanomagnets will remain magnetized in the same direction due to their size and shape. The size ensures that the nanomagnets will be single domain, which is general true regardless of their shape when the nanomagnets are smaller than the typical size of domain walls (e.g., approximately 100 nm). The elongated shape introduces uniaxial shape anisotropy and magnets minimize their energies by aligning their magnetization with the anisotropy easy direction. In fact, since the anisotrophy favor single magnetic domains, elongated nanostructures are single domain up to lengths of approximately 500 nm. This range of lengths of approximately 500 nm or less corresponds with the operational nanorelay lengths of interest. The coercive field of the nanomagnets is large enough to ensure that the nanomagnets do not switch magnetizations when the nanomagnets are in proximity to each other and can be controlled by varying the thickness and hardness of the nanomagnets. It is desirable that the nanomagnets are not closer to each other than about 1 nm since adhesion between metallic surfaces is thirty times or more stronger than van der Waals forces.

Figure 10A:
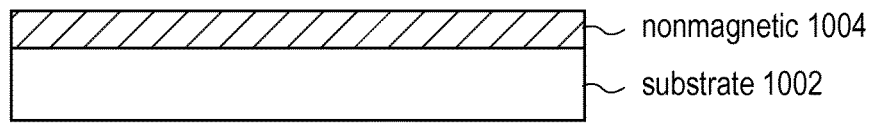
FIGS. 10A-10J illustrate a method with process operations for fabricating a NEMS device with nanomagnets in accordance with one embodiment of the present invention.
Figure 10B:
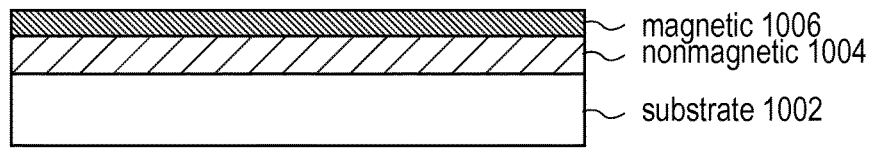

FIGS. 10A-10J illustrate a method with process operations for fabricating a NEMS device with nanomagnets in accordance with one embodiment of the present invention. FIG. 10A illustrates a process operation with at least one nonmagnetic metal layer 1004 (e.g., Ta, Ru) being formed (e.g., sputtered) on a silicon substrate 1002. The at least one nonmagnetic metal layer can provide a crystallization template (e.g., orientation) for a subsequently grown or sputtered magnetic layer. This nonmagnetic layer can also prevent diffusion from the subsequently grown or sputtered magnetic layer and the silicon substrate. FIG. 10B illustrates a process operation with a ferromagnetic metal layer 1006 (e.g., Co) being formed (e.g., sputtered) on the at least one nonmagnetic metal layer 1004.

Figure 10C:
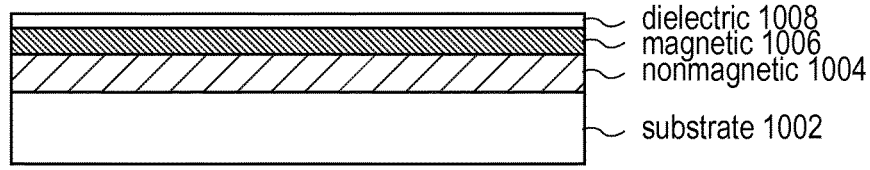
Figure 10D:
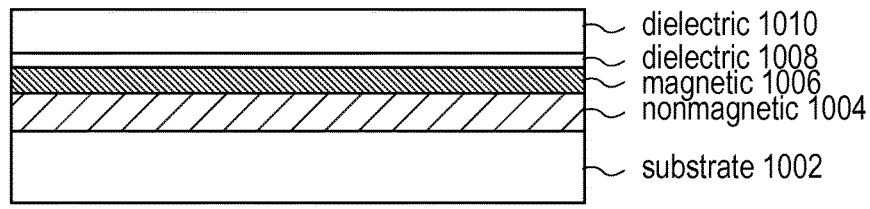
Figure 10E:
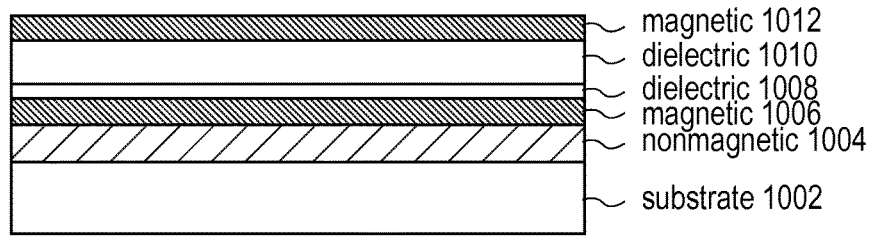

FIG. 10C illustrates a process operation with a dielectric layer 1008 (e.g., Ta, Ru) being formed (e.g., sputtered) on the ferromagnetic layer 1006. FIG. 10D illustrates a process operation with a dielectric layer 1010 (e.g., sacrificial oxide) being deposited on the dielectric layer 1008. FIG. 10E illustrates a process operation with a ferromagnetic metal layer 1012 (e.g., Ta, Ru) being formed (e.g., sputtered) on the dielectric layer 1010.

Figure 10F:
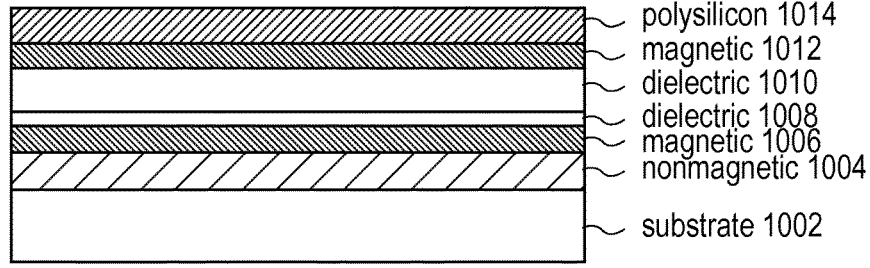
Figure 10G:
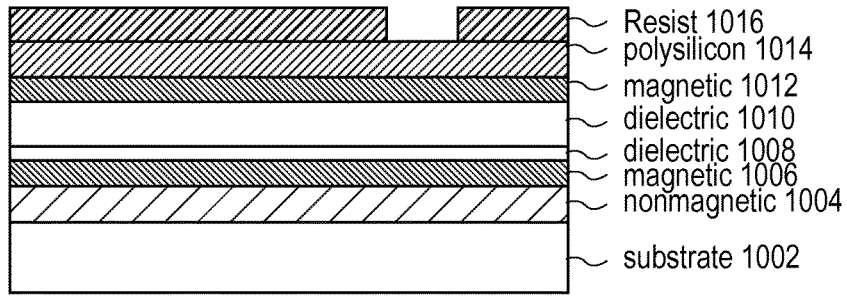
Figure 10H:
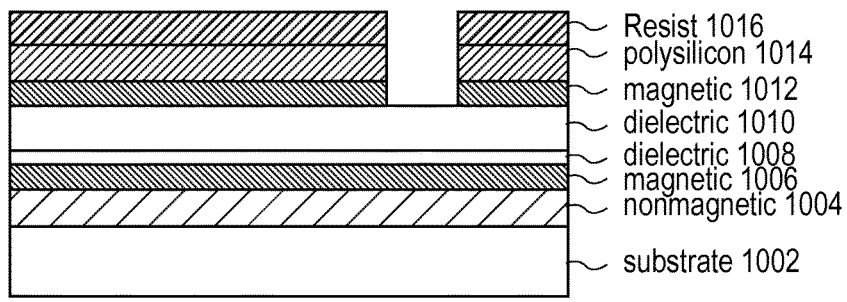
Figure 10I:
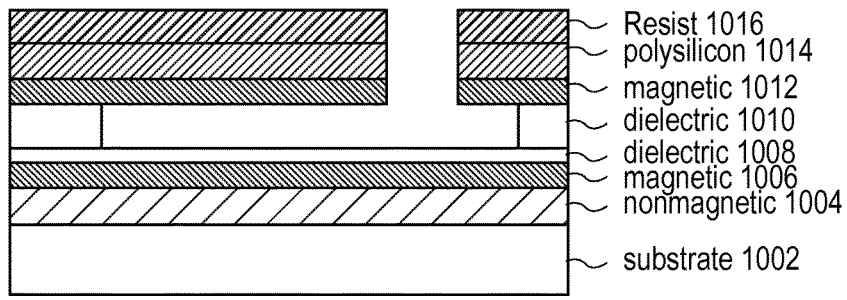
Figure 10J:
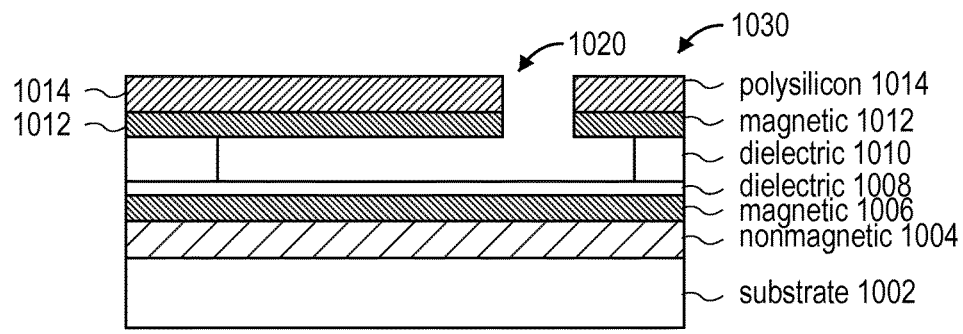

FIG. 10F illustrates a process operation with a polysilicon layer 1014 (or semiconductor or metallic layer) being deposited on the ferromagnetic layer 1012. FIG. 10G illustrates process operations with a photoresist layer 1016 being formed on the polysilicon layer 1014, lithography, and then development and removal of the exposed regions of the photoresist. FIG. 10H illustrates a reactive ion etch (RIE) process operation with regions that are not masked by the photoresist being etched including the polysilicon layer 1014 and the ferromagnetic metal layer 1012. FIG. 10I illustrates a wet etch process operation with exposed regions of the dielectric layer 1010 being etched. A cantilever 1020 is formed based on the RIE and wet etch operations. FIG. 10J illustrates a process operation with the photoresist being removed to form a NEM device 1030 that includes nanomagnets 1006 and 1012.

Figure 11:
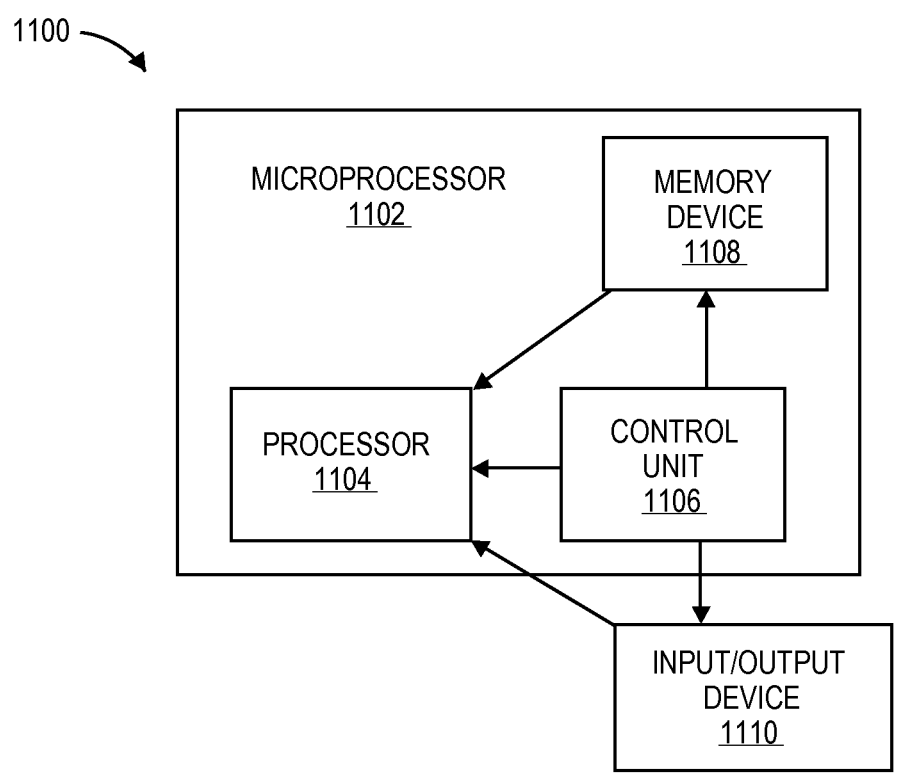
FIG. 11 illustrates a block diagram of an electronic system, in accordance with an embodiment of the present invention.

FIG. 11 illustrates a block diagram of an electronic system 1100, in accordance with an embodiment of the present invention. The electronic system 1100 can correspond to, for example, a portable system, a computer system, a process control system, or any other system that utilizes a processor and an associated memory. The electronic system 1100 may include a microprocessor 1102 (having a processor 1104 and control unit 1106), a memory device 1108, and an input/output device 1110 (it is to be understood that the electronic system 1100 may have a plurality of processors, control units, memory device units and/or input/output devices in various embodiments). In one embodiment, the electronic system 1100 has a set of instructions that define operations which are to be performed on data by the processor 1104, as well as, other transactions between the processor 1104, the memory device 1108, and the input/output device 910. The control unit 1106 coordinates the operations of the processor 1104, the memory device 1108 and the input/output device 1110 by cycling through a set of operations that cause instructions to be retrieved from the memory device 1108 and executed. The memory device 1108 can include NEMS devices (e.g., NEMS relays) as described in the present description. In an embodiment, the memory device 1108 is embedded in the microprocessor 102, as depicted in FIG. 11.

Figure 12:
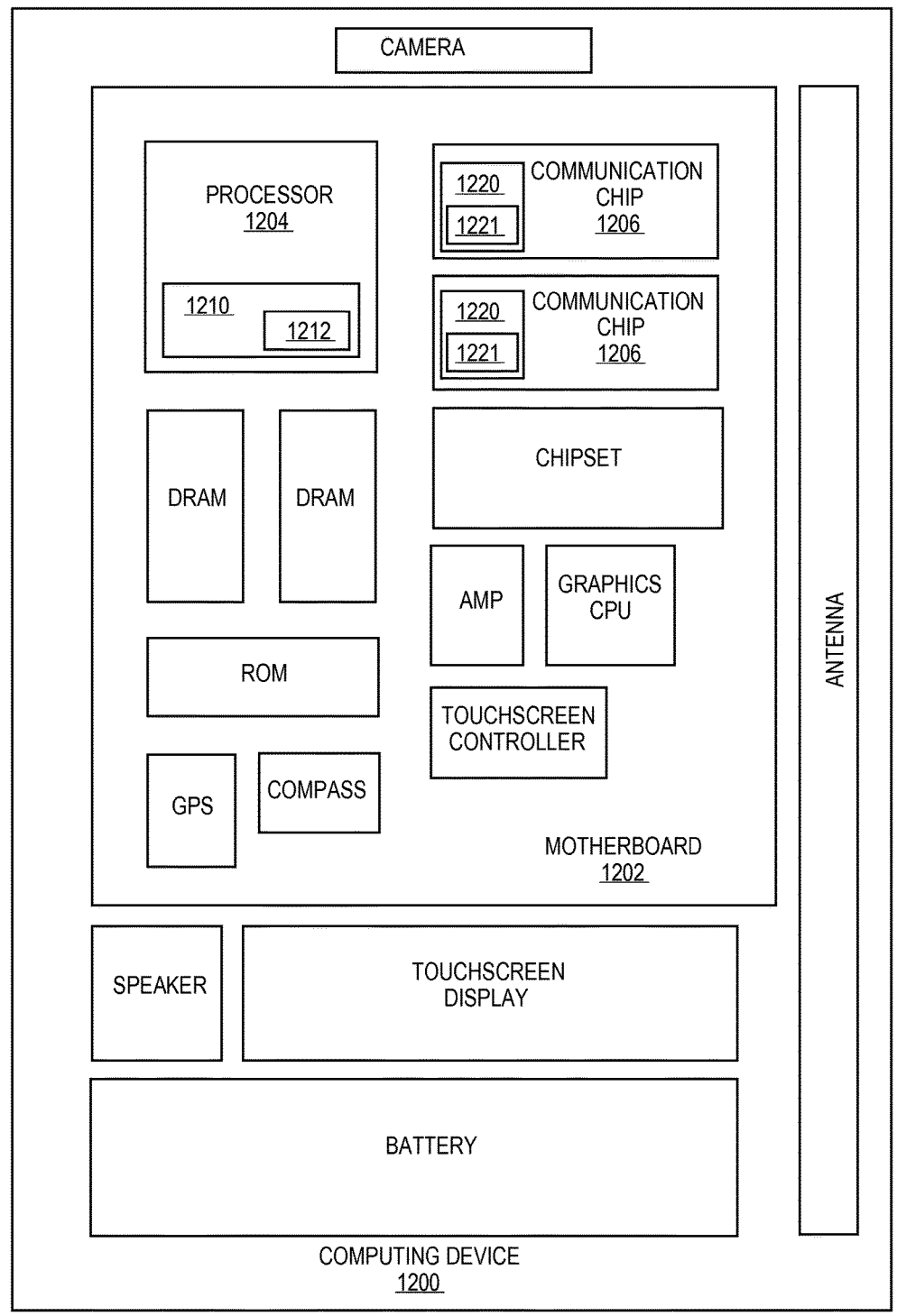
FIG. 12 illustrates a computing device in accordance with one implementation of the invention.

FIG. 12 illustrates a computing device 1200 in accordance with one implementation of the invention. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die 1210 packaged within the processor 1204. In some implementations of the invention, the integrated circuit die of the processor includes one or more devices 1212, such as spin transfer torque memory built in accordance with implementations of the invention. The term "processor" may refer to any device or portion of a device that processes electronic data from registers and/or memory to transform that electronic data into other electronic data that may be stored in registers and/or memory.

The communication chip 1206 also includes an integrated circuit die 1220 packaged within the communication chip 1206. In accordance with another implementation of the invention, the integrated circuit die of the communication chip includes one or more devices 1221, such as NEMS devices built in accordance with implementations of the invention.

In further implementations, another component housed within the computing device 1200 may contain an integrated circuit die that includes one or more devices, such as NEMS devices built in accordance with implementations of the invention.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Accordingly, one or more embodiments of the present invention relate generally to the NEMS devices having nanomagnets with enhanced operating voltage and improved control of dimensions of a cantilever and a gap between the cantilever and a substrate.

In an embodiment, a nanoelectromechanical (NEMS) device includes a substrate layer, a first magnetic layer disposed above the substrate layer, a first dielectric layer disposed above the first magnetic layer, a second dielectric disposed above the first dielectric layer, and a cantilever disposed above the second dielectric layer. The cantilever bends from a first position to a second position towards the substrate layer when a voltage is applied to the cantilever.

In one embodiment, the cantilever includes a second magnetic layer and a polysilicon layer disposed above the second magnetic layer. The first magnetic layer and the second magnetic layer may include Cobalt (Co).

In one embodiment, the first and second magnetic layers generate a magnetic field that counteracts an adhesion field to lower an operational voltage of the NEMS device.

In one embodiment, the first and second magnetic layers generate a magnetic field that counteracts an adhesion field to increase size ranges for a length and a thickness of the cantilever and increase a range of acceptable gaps between the cantilever and the first dielectric layer.

In one embodiment, the cantilever while in the second position contacts the first dielectric layer with the adhesion field applying a force for keeping the cantilever in contact with the first dielectric layer. The cantilever is restored from the second position to the first position having no contact with the first dielectric layer when the voltage is removed from the cantilever.

In one embodiment, the NEMS device further includes a non-magnetic layer disposed above the substrate.

In one embodiment, the nanoelectromechanical (NEMS) device includes a substrate, a source region disposed above or formed in the substrate, a drain region disposed above or formed in the substrate, and a gate region disposed above or formed in the substrate. The gate region includes a first magnetic layer. The source region includes a cantilever having a second magnetic layer with the cantilever bending from a first position to a second position in contact with the drain region when a voltage is applied to the gate region.

In one embodiment, the NEMS device is a relay for switching between the first and second positions.

In one embodiment, the first and second magnetic layers generate a magnetic field that counteracts an adhesion field to lower an operational voltage of the NEMS device. The first magnetic layer and the second magnetic layer comprise Cobalt (Co).

In one embodiment, the first and second magnetic layers generate a magnetic field that counteracts an adhesion field to increase size ranges for a length and a thickness of the cantilever and a range of acceptable gaps between the cantilever and the drain region.

In one embodiment, the cantilever includes a free end that contacts the drain region while in the second position with the adhesion field applying a force for keeping the cantilever in contact with the drain region. The cantilever is restored from the second position to the first position having no contact with the drain region when the voltage is removed from the gate region.

In one embodiment, a computing device includes at least one processor for executing instructions of one or more software programs and at least one communication chip communicatively coupled to the at least one processor. The at least one processor or the at least one communication chip further include at least one nanoelectromechanical (NEMS) device that includes a source region, a drain region, and a gate region having a first magnetic layer. The source region includes a cantilever having a second magnetic layer with the cantilever bending from a first position to a second position in contact with the drain region when a voltage is applied to the gate region.

In one embodiment, the first and second magnetic layers generate a magnetic field that counteracts an adhesion field to lower an operational voltage of the NEMS device.

In one embodiment, the first and second magnetic layers generate a magnetic field that counteracts an adhesion field to increase size ranges for a length and a thickness of the cantilever and a range of acceptable gaps between the cantilever and the drain region.

In one embodiment, the cantilever includes a free end that contacts the drain region while in the second position with the adhesion field applying a force for keeping the cantilever in contact with the drain region.

In one embodiment, the cantilever is restored from the second position to the first position having no contact with the drain region when the voltage is removed from the gate region.

In one embodiment, a method for fabricating a nanoelectromechanical (NEMS) device with nanomagnets includes forming at least one nonmagnetic metal layer on a substrate, forming a first ferromagnetic metal layer on the at least one nonmagnetic metal layer, forming a first dielectric layer on the ferromagnetic layer, depositing a second dielectric layer on the first dielectric layer, forming a second ferromagnetic metal layer on the second dielectric layer, depositing a polysilicon layer on the second ferromagnetic layer, and etching regions of the polysilicon layer, the second ferromagnetic layer, and the second dielectric layer that are not masked by the photoresist to form a cantilever that bends from a first position to a second position towards the substrate when a voltage is applied to the cantilever.

In one embodiment, the first and second ferromagnetic layers generate a magnetic field that counteracts an adhesion field to lower an operational voltage of the NEMS device.

In one embodiment, the first and second ferromagnetic layers generate a magnetic field that counteracts an adhesion field to increase size ranges for a length and a thickness of the cantilever and a gap between the cantilever and the first dielectric layer.

In one embodiment, an apparatus includes a means for supporting a first magnetic layer and a dielectric layer. The apparatus also includes a means for switching between a first position and a second position. The means for switching moves from a first position to a second position towards the dielectric layer when a voltage is applied to the means for switching.

In one embodiment, the means for switching comprises a second magnetic layer and a polysilicon layer. The first and second magnetic layers generate a magnetic field that counteracts an adhesion field to lower an operational voltage of the apparatus.

In one embodiment, the first and second magnetic layers generate a magnetic field that counteracts an adhesion field to increase size ranges for a length and a thickness of the means for switching and to increase a range of acceptable gaps between the means for switching and the dielectric layer.

The invention claimed is:

1. A nanoelectromechanical (NEMS) device, comprising:
   a substrate layer;
   a first magnetic layer disposed above the substrate layer, the first magnetic layer having a top surface;
   a first dielectric layer disposed above the entire top surface of the first magnetic layer;
   a second dielectric disposed above the first dielectric layer; and
   a cantilever disposed above the second dielectric layer, the cantilever bends from a first position to a second position towards the substrate layer when a voltage is applied to the cantilever,
   wherein the cantilever comprises a second magnetic layer and a polysilicon layer disposed above the second magnetic layer.

2. The NEMS device of claim 1, wherein the first magnetic layer and the second magnetic layer generate a magnetic field that counteracts an adhesion field to lower an operational voltage of the NEMS device.

3. The NEMS device of claim 2, wherein the cantilever in the second position contacts the first dielectric layer with the adhesion field applying a force for keeping the cantilever in contact with the first dielectric layer.

4. The NEMS device of claim 3, wherein the cantilever is restored from the second position to the first position having no contact with the first dielectric layer when the voltage is removed from the cantilever.

5. The NEMS device of claim 1, wherein the first magnetic layer and the second magnetic layer generate a magnetic field that counteracts an adhesion field to increase size ranges for a length and a thickness of the cantilever and to increase a range of acceptable gaps between the cantilever and the first dielectric layer.

6. The NEMS device of claim 1, further comprising:
a non-magnetic layer disposed above the substrate.

7. The NEMS device of claim 1, wherein the first magnetic layer and the second magnetic layer comprise Cobalt (Co).

8. A nanoelectromechanical (NEMS) device, comprising:
a substrate;
a source region disposed above or formed in the substrate;
a drain region disposed above or formed in the substrate; and
a gate region disposed above or formed in the substrate, the gate region having a first magnetic layer, wherein the source region includes a cantilever having a second magnetic layer with the cantilever bending from a first position to a second position in contact with the drain region when a voltage is applied to the gate region, wherein the first magnetic layer and the second magnetic layer are comprised of permanent magnets, and wherein the first magnetic layer and the second magnetic layer are repulsed by each other.

9. The NEMS device of claim 8, wherein the NEMS device is a relay for switching between the first and second positions.

10. The NEMS device of claim 8, wherein the first magnetic layer and the second magnetic layer generate a magnetic field that counteracts an adhesion field to lower an operational voltage of the NEMS device.

11. The NEMS device of claim 10, wherein the cantilever includes a free end that contacts the drain region in the second position with the adhesion field applying a force for keeping the cantilever in contact with the drain region.

12. The NEMS device of claim 11, wherein the cantilever is restored from the second position to the first position having no contact with the drain region when the voltage is removed from the gate region.

13. The NEMS device of claim 8, wherein the first magnetic layer and the second magnetic layer generate a magnetic field that counteracts an adhesion field to increase size ranges for a length and a thickness of the cantilever and increase a range of acceptable gaps between the cantilever and the drain region.

14. The NEMS device of claim 8, wherein the first magnetic layer and the second magnetic layer comprise Cobalt (Co).

15. A computing device comprising:
at least one processor for executing instructions of one or more software programs; and
at least one communication chip communicatively coupled to the at least one processor,
wherein the at least one processor or the at least one communication chip further comprises at least one nanoelectromechanical (NEMS) device that includes a source region, a drain region, and a gate region having a first magnetic layer, wherein the source region includes a cantilever having a second magnetic layer with the cantilever bending from a first position to a second position in contact with the drain region when a voltage is applied to the gate region, wherein the first magnetic layer and the second magnetic layer are comprised of permanent magnets, and wherein the first magnetic layer and the second magnetic layer are repulsed by each other.

16. The computing device of claim 15, wherein the first magnetic layer and the second magnetic layer generate a magnetic field that counteracts an adhesion field to lower an operational voltage of the NEMS device.

17. The computing device of claim 16, wherein the cantilever includes a free end that contacts the drain region in the second position with the adhesion field applying a force for keeping the cantilever in contact with the drain region.

18. The computing device of claim 15, wherein the first magnetic layer and the second magnetic layer generate a magnetic field that counteracts an adhesion field to increase size ranges for a length and a thickness of the cantilever and a range of acceptable gaps between the cantilever and the drain region.

19. The computing device of claim 15, wherein the cantilever is restored from the second position to the first position having no contact with the drain region when the voltage is removed from the gate region.

20. A method for fabricating a nanoelectromechanical (NEMS) device with nanomagnets, comprising:
forming at least one nonmagnetic metal layer on a substrate;
forming a first ferromagnetic metal layer on the at least one nonmagnetic metal layer;
forming a first dielectric layer on the ferromagnetic layer;
depositing a second dielectric layer on the first dielectric layer;
forming a second ferromagnetic metal layer on the second dielectric layer;
depositing a poly silicon layer on the second ferromagnetic layer;
etching regions of the polysilicon layer, the second ferromagnetic layer, and the second dielectric layer that are not masked by the photoresist to form a cantilever that bends from a first position to a second position towards the substrate when a voltage is applied to the cantilever.

21. The method of claim 20, wherein the first and second ferromagnetic layers generate a magnetic field that counteracts an adhesion field to lower an operational voltage of the NEMS device.

22. The method of claim 20, wherein the first and second ferromagnetic layers generate a magnetic field that counteracts an adhesion field to increase size ranges for a length and a thickness of the cantilever and a gap between the cantilever and the first dielectric layer.

23. An apparatus, comprising:
a means for supporting a first magnetic layer and a dielectric layer; and
a means for switching between a first position and a second position, the means for switching moves from the first position the second position towards the dielectric layer when a voltage is applied to the means for switching, wherein the means for switching comprises the second magnetic layer and a polysilicon layer, wherein the first magnetic layer and the second magnetic layer generate a magnetic field that counteracts an adhesion field to lower an operational voltage of the apparatus, to increase size ranges for a length and a thickness of the means for switching and to increase a range of acceptable gaps between the means for switching and the dielectric layer.

24. A nanoelectromechanical (NEMS) device, comprising:
   a substrate layer;
   a first magnetic layer disposed above the substrate layer;
   a first dielectric layer disposed above the first magnetic layer;
   a second dielectric disposed above the first dielectric layer; and
   a cantilever disposed above the second dielectric layer, the cantilever bends from a first position to a second position towards the substrate layer when a voltage is applied to the cantilever, wherein the first magnetic layer and the second magnetic layer generate a magnetic field that counteracts an adhesion field to increase size ranges for a length and a thickness of the cantilever and to increase a range of acceptable gaps between the cantilever and the first dielectric layer.

25. A nanoelectromechanical (NEMS) device, comprising:
   a substrate;
   a source region disposed above or formed in the substrate;
   a drain region disposed above or formed in the substrate; and
   a gate region disposed above or formed in the substrate, the gate region having a first magnetic layer, wherein the source region includes a cantilever having a second magnetic layer with the cantilever bending from a first position to a second position in contact with the drain region when a voltage is applied to the gate region, wherein the first magnetic layer and the second magnetic layer generate a magnetic field that counteracts an adhesion field to increase size ranges for a length and a thickness of the cantilever and increase a range of acceptable gaps between the cantilever and the drain region.

26. A computing device comprising:
   at least one processor for executing instructions of one or more software programs; and
   at least one communication chip communicatively coupled to the at least one processor, wherein the at least one processor or the at least one communication chip further comprises at least one nanoelectromechanical (NEMS) device that includes a source region, a drain region, and a gate region having a first magnetic layer, wherein the source region includes a cantilever having a second magnetic layer with the cantilever bending from a first position to a second position in contact with the drain region when a voltage is applied to the gate region, wherein the first magnetic layer and the second magnetic layer generate a magnetic field that counteracts an adhesion field to increase size ranges for a length and a thickness of the cantilever and a range of acceptable gaps between the cantilever and the drain region.

\* \* \* \* \*